United States Patent
Yamaguchi (10) Patent No.: US 9,154,291 B2
(45) Date of Patent: Oct. 6, 2015

(54) DIFFERENTIAL SIGNAL SKEW ADJUSTMENT METHOD AND TRANSMISSION CIRCUIT

(71) Applicant: FUJITSU LIMITED, Kawasaki-shi, Kanagawa (JP)

(72) Inventor: Hisakatsu Yamaguchi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 118 days.

(21) Appl. No.: 14/032,738

(22) Filed: Sep. 20, 2013

(65) Prior Publication Data

US 2014/0176208 A1      Jun. 26, 2014

(30) Foreign Application Priority Data

Dec. 26, 2012   (JP) ................................. 2012-283079

(51) Int. Cl.
    *H03L 7/08*      (2006.01)
    *H04L 7/00*      (2006.01)

(52) U.S. Cl.
    CPC .... *H04L 7/00* (2013.01); *H03L 7/08* (2013.01)

(58) Field of Classification Search
    CPC ........... H03L 7/08; H03M 9/00; H04L 47/10; H04L 47/41; G11C 7/22; G11C 5/06
    USPC .......................................... 327/156, 158, 161
    See application file for complete search history.

(56) References Cited

U.S. PATENT DOCUMENTS

| 2007/0047667 A1* | 3/2007 | Shumarayev ................. 375/295 |
| 2009/0225900 A1* | 9/2009 | Yamaguchi et al. .......... 375/296 |

FOREIGN PATENT DOCUMENTS

| JP | 11-510338 A   | 9/1999 |
| JP | 3411574 B2    | 6/2003 |
| JP | 2005-268844 A | 9/2005 |
| WO | WO 94/24797 A1 | 10/1994 |
| WO | WO 97/05701 A2 | 2/1997 |

\* cited by examiner

*Primary Examiner* — John Poos
(74) *Attorney, Agent, or Firm* — Arent Fox LLP (57) ABSTRACT

A differential signal skew adjustment method includes: outputting a differential data signal including a first polarity signal and a second polarity signal from a transmission circuit in synchronization with a cycle of a reference clock; adjusting a phase of a detection clock obtained by dividing the reference clock in accordance with a phase of the first polarity signal; and adjusting a phase of the second polarity signal in accordance with an adjusted phase of the detection clock to adjust skew between the first polarity signal and the second polarity signal.

13 Claims, 11 Drawing Sheets

SKEW BETWEEN DIFFERENTIAL
OUTPUT DATA SIGNALS

FIG. 3B

NO SKEW BETWEEN DIFFERENTIAL
OUTPUT DATA SIGNALS

DIFFERENTIAL SIGNAL SKEW ADJUSTMENT METHOD AND TRANSMISSION CIRCUIT

CROSS-REFERENCE TO RELATED APPLICATION

This application is based upon and claims the benefit of priority of the prior Japanese Patent Application No. 2012-283079, filed on Dec. 26, 2012, the entire contents of which are incorporated herein by reference.

FIELD

The embodiments discussed herein are related to a differential signal skew adjustment method and a transmission circuit.

BACKGROUND

High-speed input-output (I/O) data transmission and reception circuits are used in apparatuses for communication backbone and information processing devices such as servers. The high-speed I/O data transmission and reception circuits transmit and receive signals at high bit rates in data transmission and reception between boards or cases, in data transmission and reception between large scale integrations (LSIs), or between multiple elements or circuit blocks in chips.

Related technologies are disclosed in Japanese Patent No. 3882823, Japanese Patent No. 3411574, and Japanese Laid-open Patent Publication No. 11-510338.

SUMMARY

According to one aspect of the embodiments, a differential signal skew adjustment method includes: outputting a differential data signal including a first polarity signal and a second polarity signal from a transmission circuit in synchronization with a cycle of a reference clock; adjusting a phase of a detection clock obtained by dividing the reference clock in accordance with a phase of the first polarity signal; and adjusting a phase of the second polarity signal in accordance with an adjusted phase of the detection clock to adjust skew between the first polarity signal and the second polarity signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A data transmission circuit outputs a differential data signal including a pair of two positive data signal and negative data signal (hereinafter referred to as P/N) which are different polarities. It is desirable to increase the data rate with the increasing request for high-speed data transmission.

Such a transmission circuit has, for example, a 16:1 multiplexer (MUX) function and receives 16-bit parallel data of 2 gigabytes per seconds (2 Gb/s) in synchronization with a 2-GHz clock from a peripheral logic circuit with a First-In-First-Out (FIFO). A 16-GHz reference clock is generated in an internal phase locked loop (PLL) circuit, and the 16-GHz reference clock is frequency-divided into an 8-GHz frequency dividing clock, a 4-GHz frequency dividing clock, and a 2-GHz frequency dividing clock. The 16-bit parallel data is read in synchronization with the 2-GHz frequency dividing clock from the FIFIO in the transmission circuit. The 16-bit parallel data is converted into serial data via a 16:8 multiplexer (MUX), an 8:4 multiplexer (MUX), a 4:2 multiplexer (MUX), or a 2:1 multiplexer (MUX) and a 32 Gb/s differential serial data signal is output via a pre-driver and a 50-Ω final driver. Providing a cross coupling circuit having an inverter structure between differential outputs in the pre-driver allows skew between the pieces of P/N differential output data to be reduced (deskewing). However, the skew may not be sufficiently reduced (sufficient deskewing may not be performed) over a wide range operation specifications including variations in process, voltage, and temperature (PVT).

In the skew between the pieces of P/N differential output data in the transmission circuit, the ratio of the skew with respect to the data width of one data segment (one unit interval (1 UI)) becomes relatively high with the increasing speed. For example, it is desirable to sufficiently reduce the skew between the pieces of P/N differential output data to decrease the ratio of the skew.

Figure 1:
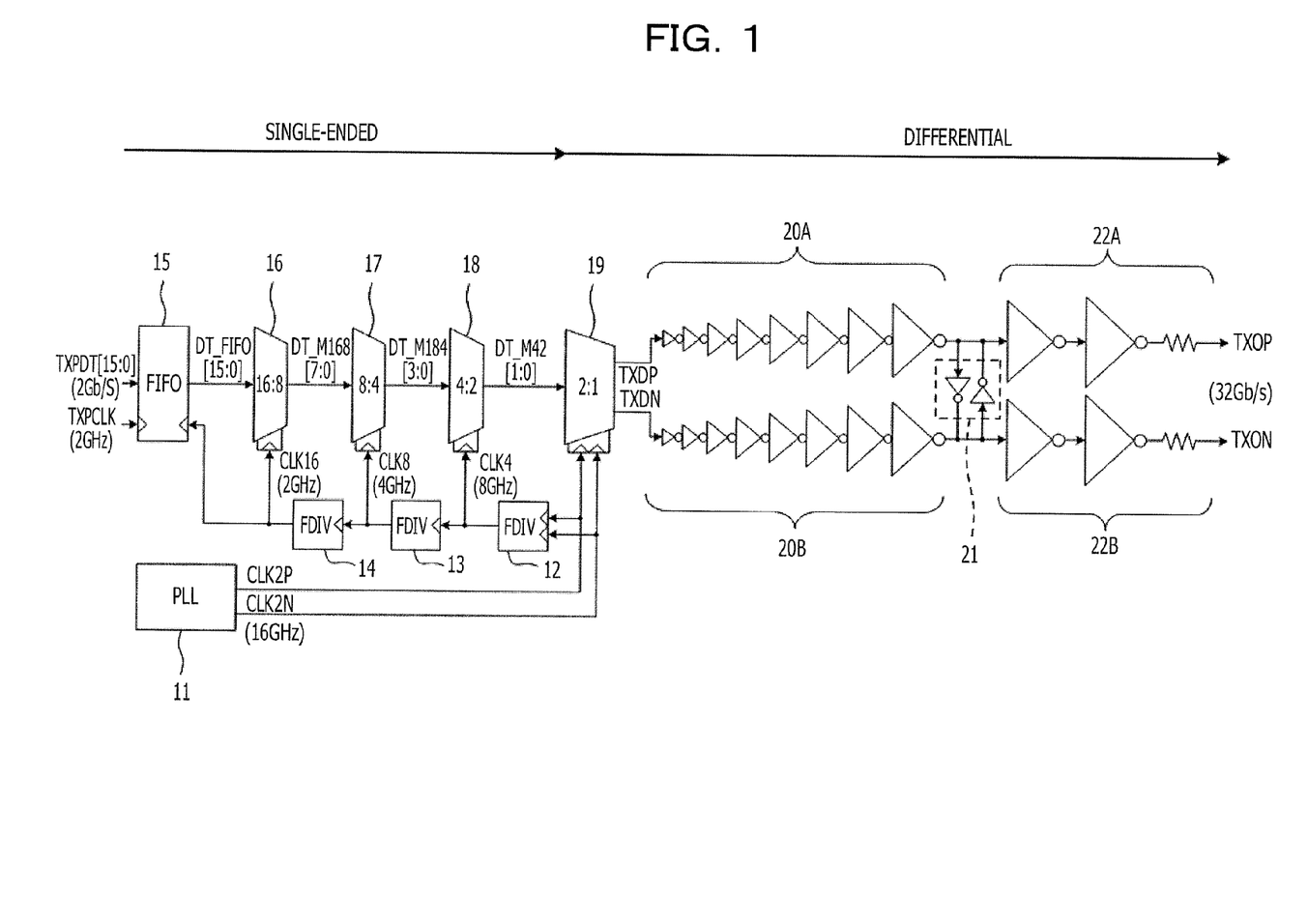
FIG. 1 illustrates an example of a transmission circuit.

FIG. 1 illustrates an example of a transmission circuit. In the transmission circuit in FIG. 1, the 16-bit parallel data output in synchronization with the 2-GHz clock may be converted into one-bit serial data and the 16-GHz clock may be output at double rate. For example, the serial data may be varied at 32 Gb/s and one data segment (one unit interval (1 UI)) may be about 30 picoseconds.

Referring to FIG. 1, the transmission circuit includes a PLL circuit 11, a frequency divider circuit, an FIFO 15, a multiplexer circuit, a pre-driver, a cross coupling circuit 21, and a final driver. The PLL circuit 11 receives the 2-GHz clock from a peripheral logic circuit to generate 16-GHz differential clocks CLK2P and CLK2N.

The frequency divider circuit includes a first frequency divider 12, a second frequency divider 13, and a third frequency divider 14. The first frequency divider 12 generates an 8-GHz single-phase clock CLK4 resulting from frequency division by two from the differential clocks CLK2P and CLK2N. The second frequency divider 13 generates a 4-GHz single-phase clock CLK8 resulting from frequency division by two from the single-phase clock CLK4. The third frequency divider 14 generates a 2-GHz single-phase clock CLK16 resulting from frequency division by two from the single-phase clock CLK8.

The FIFO 15 may be an FIFO circuit that outputs output data written in accordance with a writing clock in the order of writing in accordance with a reading clock. A 16-bit transmission data TXPDT is written into the FIFO 15 in synchronization with a 2-GHz single-phase clock TXPCLK and is sequentially output as 16-bit output data DT_FIFO in accordance with the 2-GHz clock CLK16 in the written order.

The multiplexer circuit includes a first multiplexer 16, a second multiplexer 17, a third multiplexer 18, and a fourth multiplexer 19. The first multiplexer 16 multiplexes the 16-bit output data DT_FIFO output from the FIFO 15 to an eight-bit data DT_M168 in accordance with the clock CLK16. The second multiplexer 17 multiplexes the eight-bit data DT_M168 output from the first multiplexer 16 to a four-bit data DT_M84 in accordance with the clock CLK8. The third multiplexer 18 multiplexes the four-bit data DT_M84 output from the second multiplexer 17 to a two-bit data DT_M42 in accordance with the clock CLK4. The fourth multiplexer 19 multiplexes the two-bit data DT_M42 output from the third multiplexer 18 to a one-bit differential data signal in accordance with the differential clocks CLK2P and CLK2N to output the signal resulting from the multiplexing as P/N differential output data signals TXDP and TXDN. Since the fourth multiplexer 19 outputs the data signals at double rate, the P/N differential output data signals TXDP and TXDN may be varied at 32 Gb/s and one unit interval (1 UI) may be about 30 picoseconds.

The pre-driver includes a positive pre-driver 20A and a negative pre-driver 20B. The positive pre-driver 20A and the negative pre-driver 20B each include many complementary metal oxide semiconductor (CMOS) inverter circuits coupled in series to each other and are adjusted to have impedance appropriate for the final driver. The inverter circuits are coupled in the manner illustrated in FIG. 1 because the drive capability (fanout) at low voltage and in high-speed operation is insufficient with one CMOS inverter circuit. The multi-stage connection is adopted to adjust the impedance so as to achieve a desired drive capability. The positive pre-driver 20A adjusts the impedance of the differential output data signal TXDP, which is one of the P/N differential output data signals, and the negative pre-driver 20B adjusts the impedance of the differential output data signal TXDN, which is the other of the P/N differential output data signals.

The final driver includes a positive final driver 22A and a negative final driver 22B. The positive final driver 22A and the negative final driver 22B each include two-stage CMOS inverter circuits coupled in series to each other and a resistor and each output a signal corresponding to a certain termination resistance. The positive final driver 22A outputs a differential output data signal TXOP corresponding to the output from the positive pre-driver 20A. The negative final driver 22B outputs a differential output data signal TXON corresponding to the output from the negative pre-driver 20B.

Figure 2:
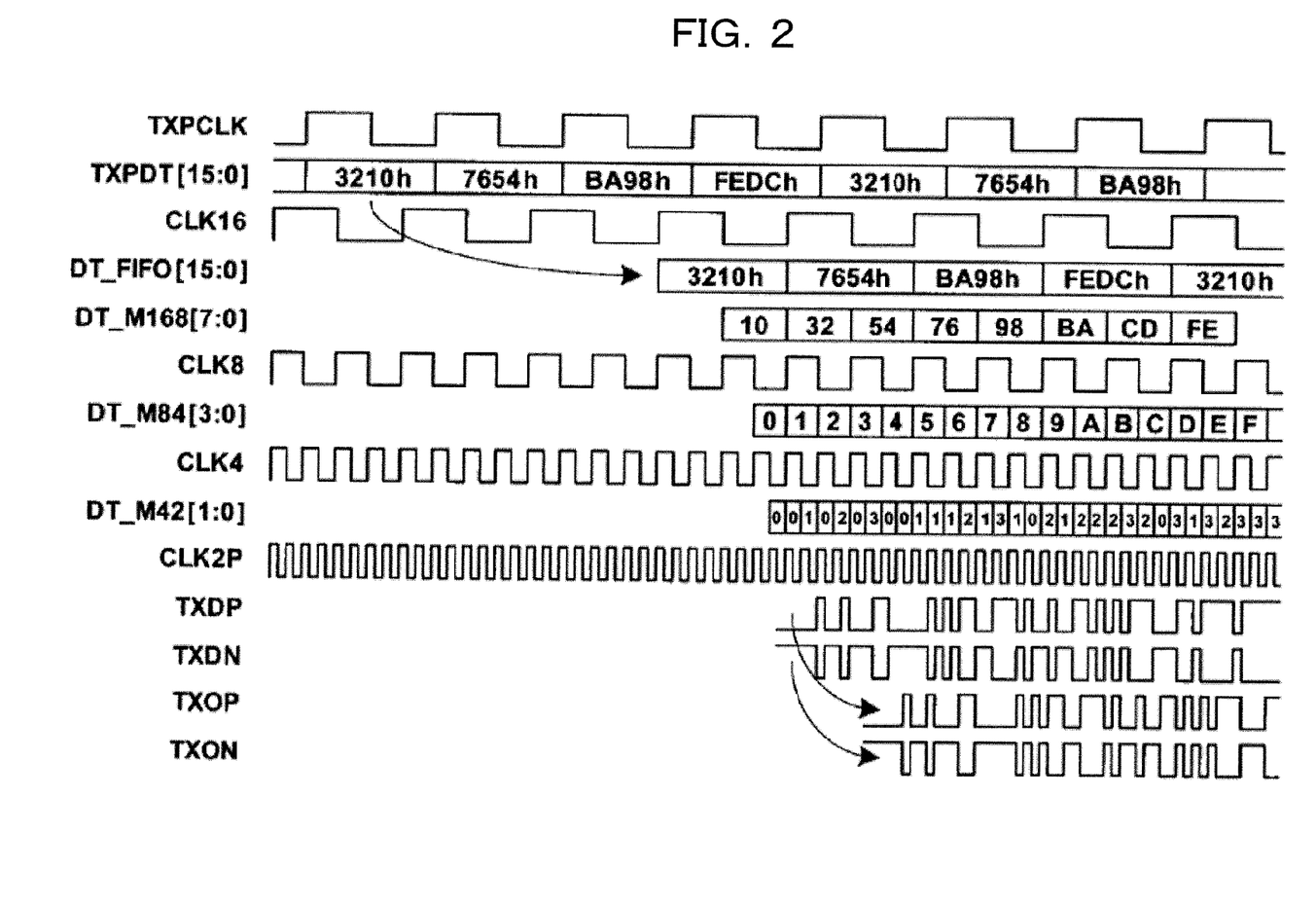
FIG. 2 illustrates an example of an operation of a transmission circuit.

FIG. 2 illustrates an example of an operation of a transmission circuit. The transmission circuit in FIG. 2 may be the transmission circuit illustrated in FIG. 1. The signals from the components in the transmission circuit when 16-bit data "3210h (hexadecimal format)", 16-bit data "7654h", 16-bit data "BA98h", . . . are sequentially output are illustrated in FIG. 2.

The inverters of the same number, which are designed substantially in the same manner, are coupled in the positive pre-driver 20A and the negative pre-driver 20B. The difference in signal delay between two systems, for example, the skew between two signals may occur at the low voltage and in the high-speed operation.

Figure 3A:
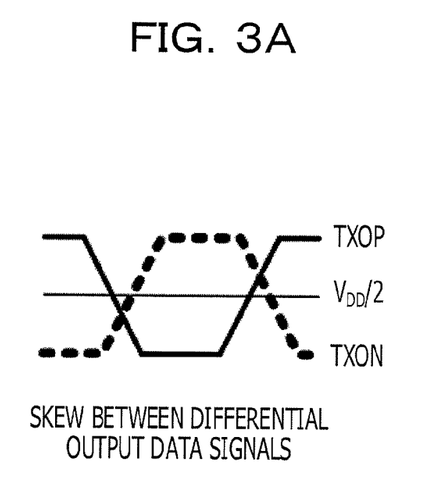
FIGS. 3A and 3B illustrate an example of differential output data signals.
Figure 3B:
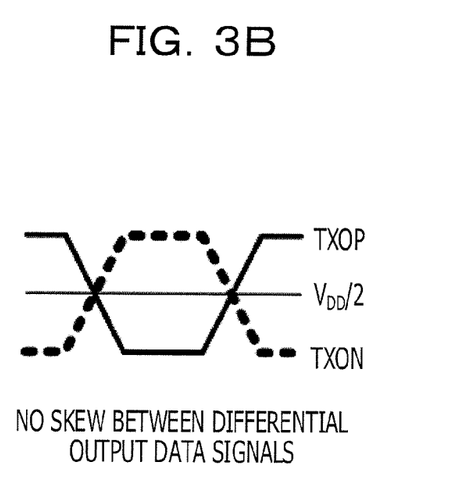

FIG. 3A and FIG. 3B illustrates an example of differential output data signals. FIG. 3A illustrates a case in which the skew occurs in the P/N differential output data signals TXOP and TXON illustrated in FIG. 1. FIG. 3B illustrates a case in which no skew occurs in the P/N differential output data signals TXOP and TXON illustrated in FIG. 1.

In FIG. 3A and FIG. 3B, the amplitude at a crossing point of the P/N differential output data signals TXOP and TXON is set to a value of $V_{DD}/2$, which is half of a power supply voltage $V_{DD}$. It is considered that no skew occurs when the P/N differential output data signals pass through (crosses) the $V_{DD}/2$ level contemporaneously. The deskewing may mean the reduction of the skew between the P/N differential output data signals in the transmission circuit.

In the output circuit illustrated in FIG. 1, the cross coupling circuit 21 having the inverter structure is provided to reduce the skew between the signals. For example, the skew may not be sufficiently reduced over the wide range operation specifications including the variations in the process, voltage, and temperature (PVT) by providing the cross coupling circuit 21.

Figure 4:
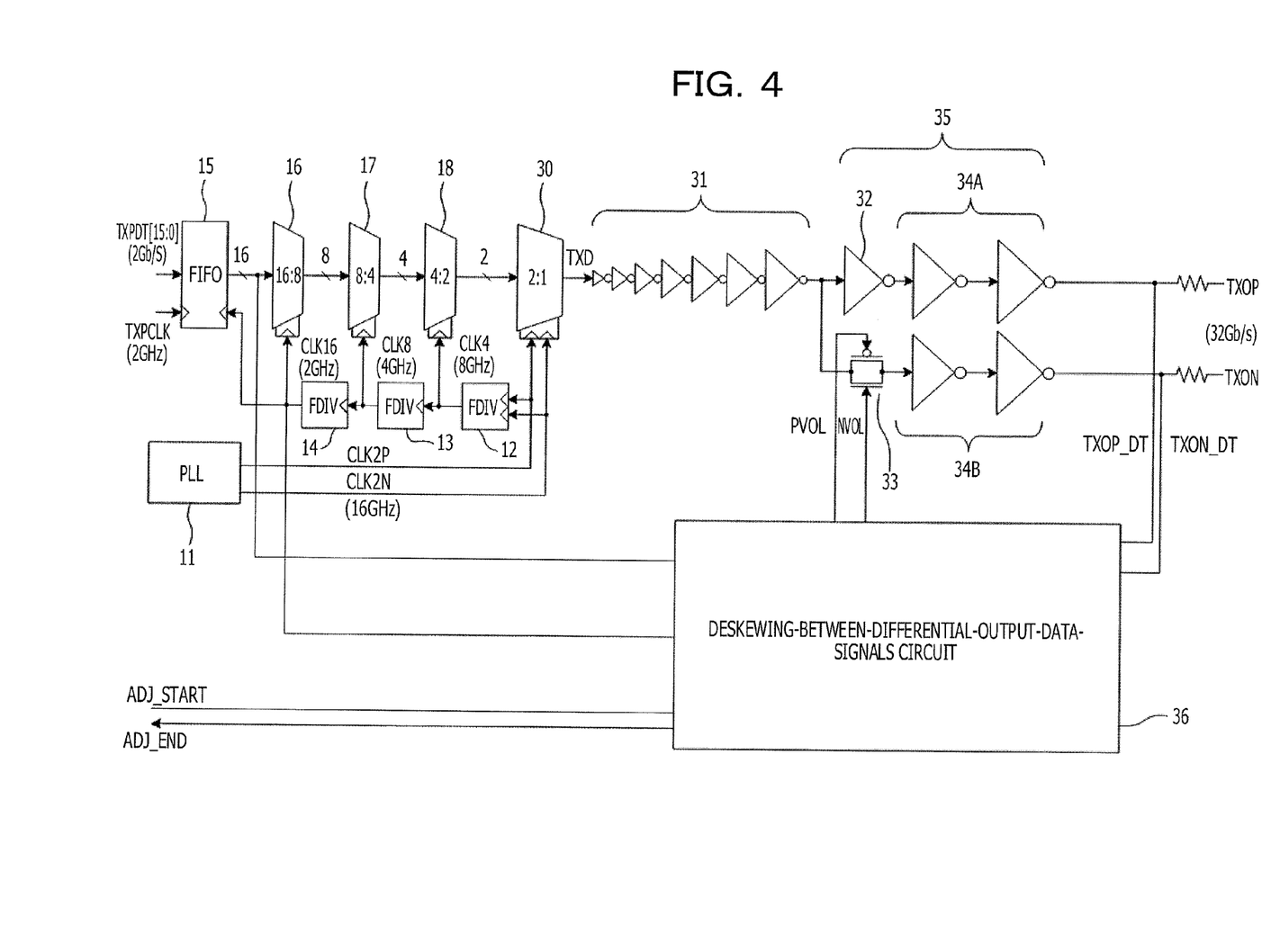
FIG. 4 illustrates an example of a transmission circuit.

FIG. 4 illustrates an example of a transmission circuit. The transmission circuit illustrated in FIG. 4 converts, for example, the 16-bit parallel data output in synchronization with the 2-GHz clock into one-bit serial data and outputs the 16-GHz clock at double rate. For example, the serial data may be varied at 32 Gb/s and one data segment (one unit interval (1 UI)) may be about 30 picoseconds.

Referring to FIG. 4, the transmission circuit includes a PLL circuit 11, a frequency divider circuit, an FIFO 15, a multiplexer circuit, a pre-driver 31, a delay circuit, a final driver 35, and a deskewing-between-differential-output-data-signals circuit 36. The PLL circuit 11, the frequency divider circuit, and the FIFO 15 may be substantially the same as or similar to the corresponding circuits illustrated in FIG. 1.

The multiplexer circuit includes a first multiplexer 16, a second multiplexer 17, a third multiplexer 18, and a fourth single multiplexer 30. The multiplexers other than the fourth single multiplexer 30 illustrated in FIG. 4 may be substantially the same as or similar to the corresponding multiplexers illustrated in FIG. 1. The fourth multiplexer 19 illustrated in FIG. 1 outputs the one-bit P/N differential output data signals TXDP and TXDN. The fourth single multiplexer 30 illustrated in FIG. 4 may output a one-bit single-phase output data signal TXD. Accordingly, the fourth single multiplexer 30 may multiplex the two-bit data output from the third multiplexer 18 to a one-bit differential data signal in accordance with the differential clocks CLK2P and CLK2N to output the signal resulting from the multiplexing as the output data signal TXD. Since the fourth single multiplexer 30 outputs the data signal at double rate, the output data signal TXD may be varied at 32 Gb/s and one unit interval (1 UI) may be about 30 picoseconds.

The pre-driver 31 has a structure in which many inverter circuits are coupled in series to each other and is adjusted to have impedance appropriate for the final driver 35. For example, in order to reduce the power consumption, all the inverter circuits may include CMOS inverter circuits. For example, when the inverter circuits are used, the drive capability (fanout) at low voltage and in high-speed operation may be insufficient with one CMOS inverter circuit. Accordingly, the multi-stage connection of the inverter circuits may achieve a desired drive capability. In the example in FIG. 1, the positive pre-driver 20A adjusts the impedance of the differential output data signal TXDP and the negative pre-driver 20B adjusts the impedance of the differential output data signal TXDN. The pre-driver 31 illustrated in FIG. 4 may adjust the impedance of the single-phase output data signal TXD.

The final driver 35 includes the delay circuit, a positive final driver 34A, and a negative final driver 34B. The delay circuit includes an inverter circuit 32 receiving the output from the final-stage CMOS inverter circuit in the pre-driver 31 and a transfer gate (hereinafter referred to as a TG) 33 receiving the output from the final-stage CMOS inverter circuit in the pre-driver 31. The inverter circuit 32 inverts the output signal from the final-stage CMOS inverter circuit in the pre-driver 31 while the TG 33 does not invert the output signal from the final-stage CMOS inverter circuit in the pre-driver 31. Accordingly, the output from the inverter circuit 32 and the output from the TG 33 may be differential signals. The inverter circuit 32 may have a structure that is substantially the same as or similar to that of the inverter circuits used in the pre-driver 31. The TG 33 includes a positive channel metal oxide semiconductor (PMOS) transistor and a negative channel metal oxide semiconductor (NMOS) transistor that are coupled in parallel to each other. Since a gate signal PVOL of the PMOS transistor and a gate signal NVOL of the NMOS transistor are dynamically varied at an analog signal level, the signal transmission time may be adjusted.

The positive final driver 34A and the negative final driver 34B each include two-stage inverter circuits coupled in series to each other and a resistor and each output a signal corresponding to a certain termination resistance. The positive final driver 34A outputs a differential output data signal TXOP corresponding to the output from the inverter circuit 32. The negative final driver 34B outputs a differential output data signal TXON corresponding to the output from the TG 33.

The deskewing-between-differential-output-data-signals circuit 36 detects the skew between the output data signals TXOP and TXON output from the final-stage inverter circuits in the positive final driver 34A and the negative final driver 34B, respectively, to vary the PVOL and the NVOL so as to reduce the skew. The deskewing-between-differential-output-data-signals circuit 36 uses the clock CLK16 and the 16-bit parallel data output from the FIFO 15 to detect the skew between the output data signals TXOP and TXON. The deskewing-between-differential-output-data-signals circuit 36 performs an adjustment operation to vary the PVOL and the NVOL so as to reduce the skew between the output data signals TXOP and TXON while a control signal ADJ_START from a logical circuit block is turned on, keeps an adjustment value upon completion of the adjustment, and turns on a control signal ADJ_END.

Single ended and differential conversion is performed on the output from the final-stage inverter circuit in the pre-driver 31 corresponding to the upstream stage of the final-stage driver of the differential output data signals. The conversion may be performed by the delay circuit including the inverter circuit 32 and the TG 33. The amount of delay at the center of an amount-of-delay adjustment range of the TG 33 may be set so as to be approximated to the amount of delay of the inverter circuit 32. The delay circuit may be provided any position in the pre-driver 31. For example, the fourth single multiplexer 30 may be replaced with the fourth multiplexer 19 in FIG. 1, which outputs the P/N differential output data signals TXDP and TXDN, the differential output data signal TXDP may be input into the inverter circuit 32, and the differential output data signal TXDN may be input into the TG 33. In this case, as in the example in FIG. 1, the positive pre-driver and the negative pre-driver may be provided. For example, in order to shorten the data path after the adjustment and reduce the subsequent variation in propagation time between the pieces of positive and negative (P/N) data, the positive pre-driver and the negative pre-driver may be provided in a node near the final driver in the transmission circuit.

The deskewing-between-differential-output-data-signals circuit 36 performs feedback control so that the central level of each of the differential output data signals TXOP and TXON from the final driver 35 (hereinafter referred to as the amplitude at a crossing point) substantially coincides with an expected amplitude. Referring to FIG. 3A and FIG. 3B, the expected amplitude may be equal to $V_{DD}/2$. The feedback control is performed by using the low-speed frequency dividing clock CLK16 in the deskewing-between-differential-output-data-signals circuit 36.

The reference clock CLK2P or CLK2N is used to adjust the skew between the differential output data signals TXOP and TXON. The differential output data signals TXOP and TXON are input into a phase comparison circuit and the input-output delay time of a skew adjustment circuit is adjusted based on the output from the phase comparison circuit. The output from the phase comparison circuit indicates whether the negative data is advanced from or is delayed from the positive data. The feedback may be performed to the transmission time through the delay circuit so that the average of the outputs from the phase comparison circuit is substantially equal to zero. For example, whether the amplitude at the crossing point substantially coincides with the expected amplitude may be not be detected. It may be difficult to provide the phase comparison circuit operating at the speed of the reference clock CLK2P or CLK2N.

Figure 5:
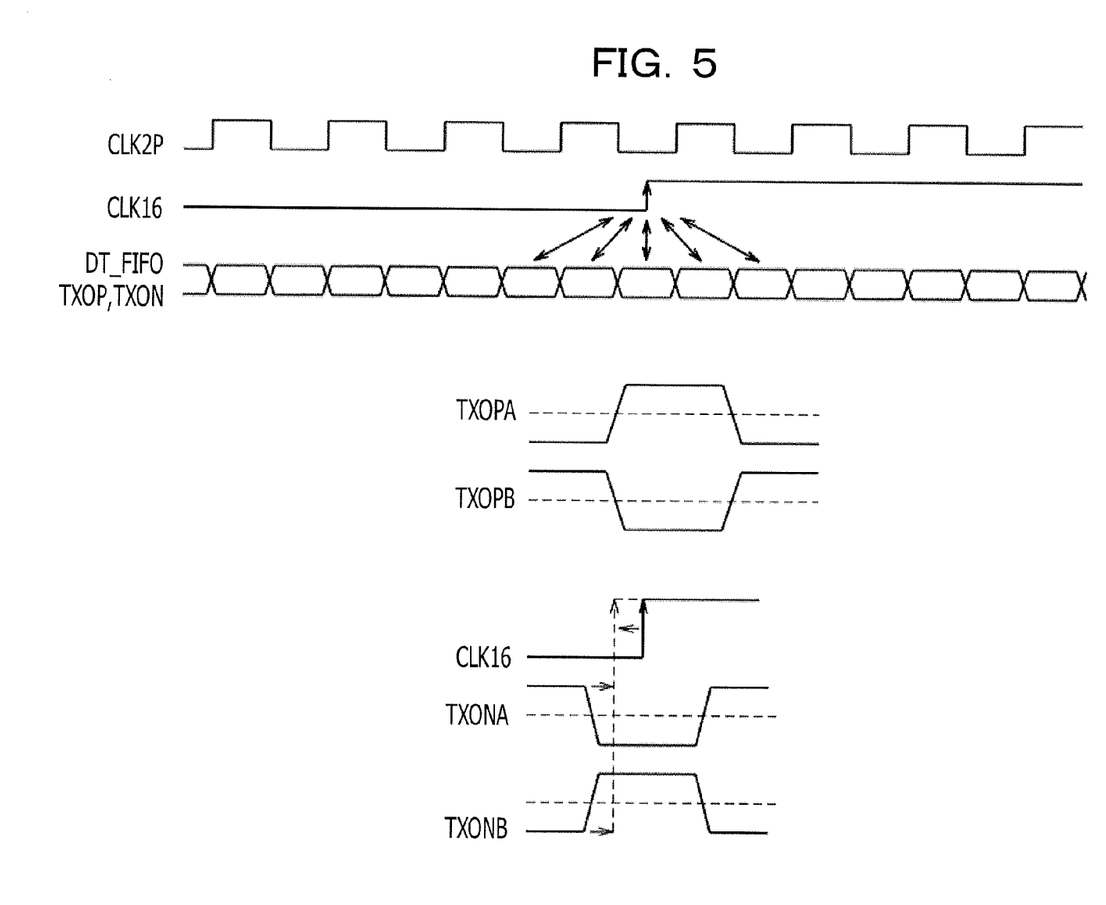
FIG. 5 illustrates an example of adjustment algorithm.

In order to provide the deskewing-between-differential-output-data-signals circuit 36 using the low-speed clock CLK16, the expected amplitude range at the crossing point is introduced so as to set timing when passing the expected amplitude range as the crossing point. FIG. 5 illustrates an example of adjustment algorithm. The adjustment algorithm illustrated in FIG. 5 may be the algorithm of the deskewing-between-differential-output-data-signals circuit 36.

As illustrated in FIG. 5, the clock CLK16 may have a cycle that is eight times longer than that of the reference clock CLK2P. Since the differential output data signals TXOP and TXON are output at double rate with respect to the reference clock CLK2P, one data segment (one unit interval (1 UI) of the differential output data signals TXOP and TXON is equal to half of the cycle of the reference clock CLK2P. The output data that is output from the FIFO 15 in accordance with the clock CLK16 and that is input into the first multiplexer 16 is output as the differential output data signals TXOP and TXON from the final driver 35 via the multiple multiplexers, the pre-driver 31, and the final driver 35. Accordingly, in the deskewing-between-differential-output-data-signals circuit 36, the phase relationship between a transition edge, for example, a rising edge of the clock CLK16 and the differential output data signals TXOP and TXON is shifted each other and the amount of shift may be 1 UI or more due to latency.

Search is performed to detect the bit position of the data that is latched at the transition edge of the clock CLK16 and that results from comparison between the differential output data signal TXOP and $V_{DD}/2$ in the parallel data output from the FIFO 15. For example, the search is performed to detect which bit in the sereal data corresponds to one bit data corresponding to the transition edge of the clock CLK16 in the serial data. As illustrated in FIG. 5, the search may be performed by sequentially confirming the bit positions in the serial data. The result of the comparison between the differential output data signal TXOP and $V_{DD}/2$ may be binary data about the differential output data signal TXOP and may be referred to as a latched result in the following description.

For example, in the deskewing-between-differential-output-data-signals circuit 36, the data resulting from the latch of the differential output data signal TXOP at the transition edge of the clock CLK16 is compared with an i-th piece of data in the parallel data to determine whether the data coincides with the i-th piece of data in the parallel data. If the data coincides with the i-th piece of data in the parallel data m times consecutively, it is determined that the i-th piece of data in the parallel data is latched at the transition edge of the clock CLK16. If the data does not coincide with the i-th piece of data in the parallel data at least one time before the coincidence occurs m times consecutively, it is determined that the i-th piece of data in the parallel data is not latched at the transition edge of the clock CLK16. If the data does not coincide with the i-th piece of data in the parallel data, a similar determination operation is continued with i being shifted. Then, a similar operation is performed with the phase of the clock CLK16 being shifted and, if the coincidence occurs m times consecutively, it is determined that the i-th piece of data in the parallel data is latched at the transition edge of the clock CLK16.

In identification of the relationship between the transition edge of the clock CLK16 and the bit position in the parallel data, the most probable bit position in the parallel data may be estimated in advance based on the configuration of the transmission circuit and the deskewing-between-differential-output-data-signals circuit 36. In order to reduce the search time, the identification may be started at the most probable bit position in the parallel data and the bit positions before and after the start bit position may be alternately searched.

When the bit position in the parallel data with respect to the transition edge of the clock CLK16 is accurately identified in consideration of, for example, the variation in PVT, the identification may be omitted.

The phase of the clock CLK16 is adjusted so that the transition edge of the clock CLK16 coincides with the transition edge of the differential output data signal TXOP. For example, the differential output data signal TXOP transits from a low (L) level to a high (H) level and transits from the H level to the L level. The transition from the L level to the H level is denoted by TXOPA and the transition from the H level to the L level is denoted by TXOPB in FIG. 5. As illustrated in FIG. 5, if the transition edge of the clock CLK16 does not substantially coincide with the transition edge of the differential output data signal TXOP (CLK16 represented by a solid line), the value resulting from the latch of the differential output data signal TXOP at the transition edge of the clock CLK16 may substantially coincide with the corresponding one bit data.

As illustrated in FIG. 5, the transition edge of the clock CLK16 is gradually shifted with respect to the differential output data signal TXOP. If the amount of shift is small, the value resulting from the latch at the transition edge of the clock CLK16 may coincide with the value of the corresponding one bit data. When the transition edge of the clock CLK16 substantially coincides with the transition edge of the differential output data signal TXOP, the value resulting from the latch at the transition edge of the clock CLK16 does not coincide with the corresponding one bit data and the probability of coincidence is halved. Gradually shifting the transition edge of the clock CLK16 allows the amount of shift where the probability of coincidence of the value resulting from the latch at the transition edge of the clock CLK16 with the corresponding one bit data is halved to be determined and the amount of shift of the transition edge of the clock CLK16 is fixed in this state. The clock CLK16 in this state may be referred to as an adjusted clock CLK16.

The adjustment is performed so that the transition edge of the differential output data signal TXON coincides with the transition edge of the adjusted clock CLK16. The differential output data signal TXON transits from the H level to the L level (TXONA) and transits from the L level to the H level (TXONB). For example, the amount of delay of the differential output data signal TXON is varied so that the probability of coincidence of the value resulting from the latch of the differential output data signal TXON at the transition edge of the adjusted clock CLK16 with the corresponding one bit data is halved. The PVOL and the NVOL to be supplied to the TG 33 in FIG. 4 are varied to vary the amount of delay of the differential output data signal TXON.

Upon completion of the adjustment, the differential output data signals TXOP and TXON enter a state in which the transition edges of the differential output data signals TXOP and TXON coincide with the transition edge of the clock CLK16, for example, a state in which the phase of the differential output data signal TXOP coincides with the phase of the differential output data signal TXON. Keeping the voltages PVOL and NVOL supplied to the TG 33 at this time may keep the state in which the phase of the differential output data signal TXOP coincides with the phase of the differential output data signal TXON.

Figure 6:
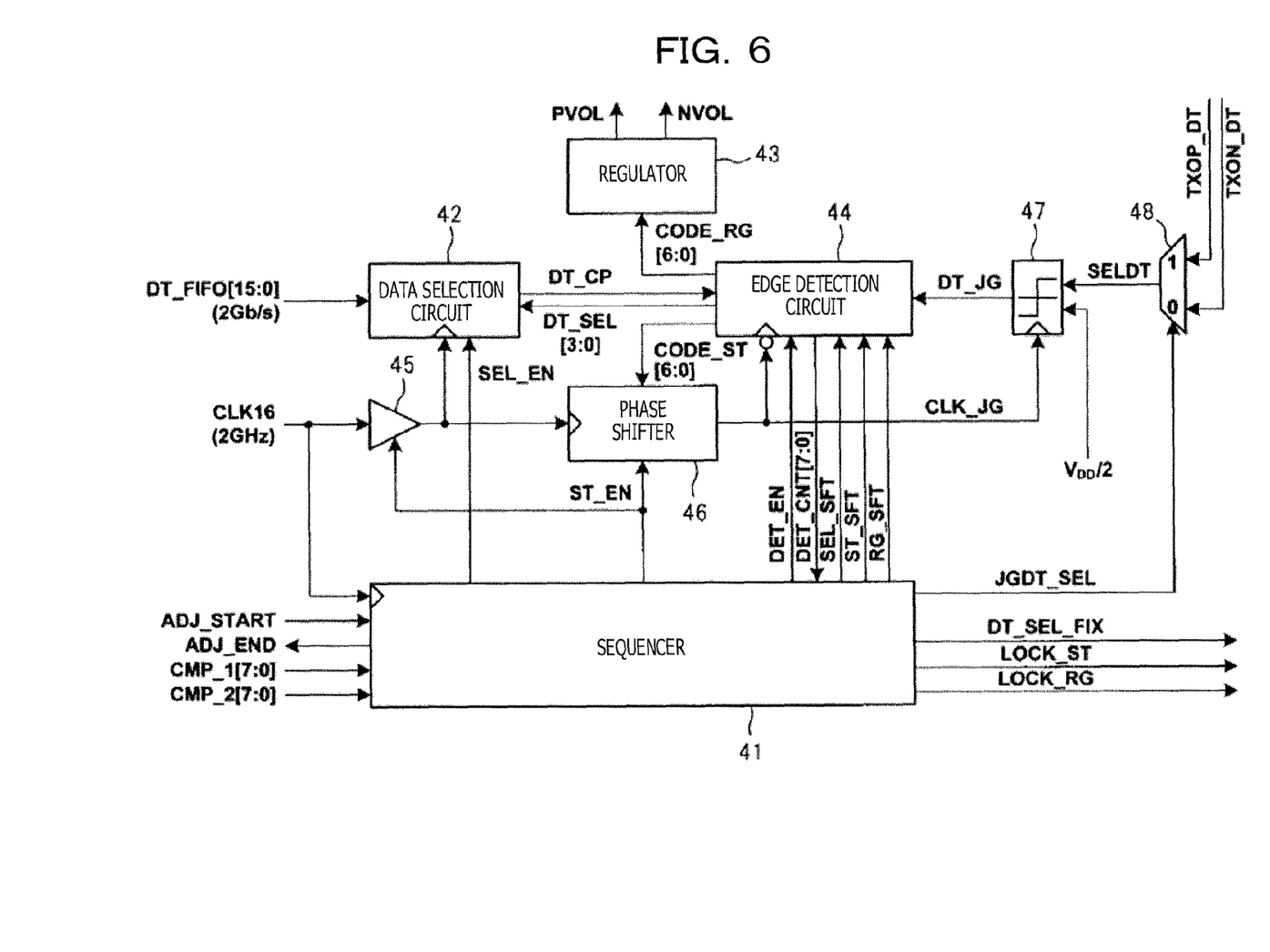
FIG. 6 illustrates an example a deskewing-between-differential-output-data-signals circuit.

FIG. 6 illustrates an example of a deskewing-between-differential-output-data-signals circuit. The deskewing-between-differential-output-data-signals circuit illustrated in FIG. 6 performs the adjustment to reduce the skew between the pieces of differential output data with the adjustment algorithm.

Referring to FIG. 6, the deskewing-between-differential-output-data-signals circuit 36 includes a sequencer 41, a data selection circuit 42, a regulator 43, an edge detection circuit 44, a buffer 45, a phase shifter 46, a comparator 47, and a selector 48. The buffer 45 may control the supply of the 2-GHz clock CLK16 to the phase shifter 46 in accordance with ST_EN.

The phase shifter 46 shifts the phase of the 2-GHz clock CLK16 in accordance with CODE_ST[6:0] to output an internal clock CLK_JG. For example, the phase shifter 46 may include a pair of a delay line receiving the clock CLK16 and a transfer gate. In the phase shifter, the addition rate may be varied to add a sine wave signal to a cosine wave signal. A known phase shifter may be used, which shifts the phase by the output that passes through its filter.

The selector 48 selects one of TXOP_DT and TXON_DT in accordance with a control signal JGDT_SEL to output the selected TXOP_DT or TXON_DT as SELDT. The comparator 47 compares one (SELDT) of the TXOP_DT and the TXON_DP, selected by the selector 48, with $V_{DD}/2$. The result of the comparison is latched with the internal clock CLK_JG output from the phase shifter 46 and is output as DT_JG.

The regulator 43 may include, for example, a digital-to-analog (DA) conversion circuit. The analog signal levels PVOL and NVOL to be applied to the gate of the TG 33 are adjusted in accordance with a voltage adjustment code CODE_RG to vary the amount of delay.

The sequencer 41 preforms the entire control in accordance with the clock CLK16. The sequencer 41 includes a counter that varies the count value in accordance with the 2-GHz frequency dividing clock CLK16 and a memory that stores control data CMP_1 and control data CMP_2 in accordance with the count value. The sequencer 41 outputs control data corresponding to the count value. The sequencer 41 starts a series of operations upon reception of ADJ_START=1 from, for example, a control logic that controls the entire transmission and reception circuit to instruct each component to operate and receives a state instruction from each component. The sequencer 41 supplies ADJ_END=1 to the control logic upon completion of the series of operations. The sequencer 41 may externally receive the signal CMP__1[7:0] for setting the number of times of comparison in the adjustment of the phase of the clock CLK16 and the eight-bit signal CMP__2[7:0] for setting the number of times of comparison in the adjustment of the transition edge of the differential output data signal TXON.

Figure 7:
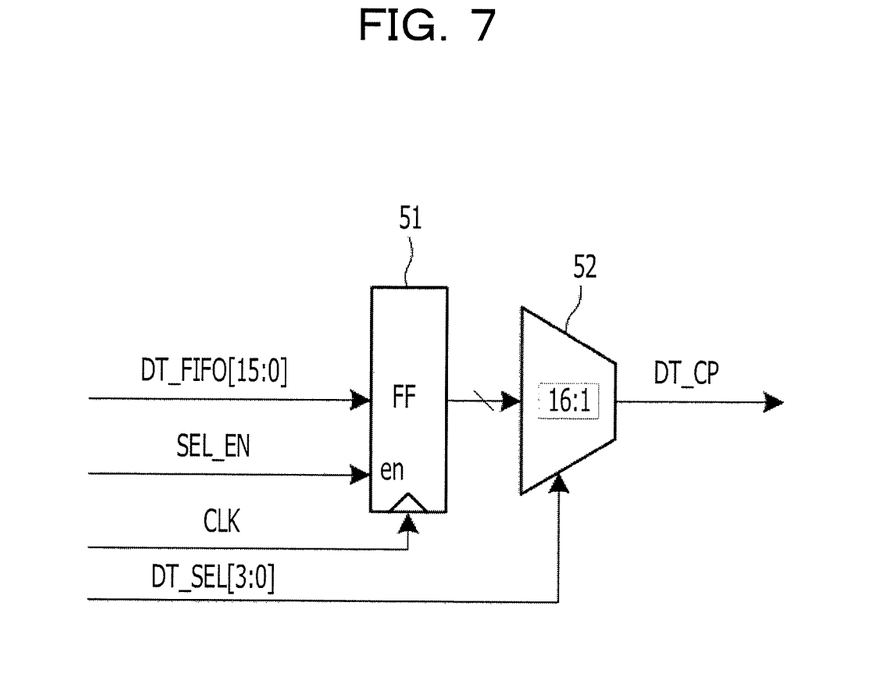
FIG. 7 illustrates an example of a data selection circuit.

The data selection circuit 42 outputs the corresponding one bit data from the 16-bit parallel data DT_FIFO[15:0] output from the FIFO 15 in accordance with a selection signal DT_SEL[3:0] generated by the edge detection circuit 44. Only the corresponding one bit data may be output. FIG. 7 illustrates an example of a data selection circuit.

Referring to FIG. 7, the data selection circuit 42 includes a flip-flop (FF) 51 and a selector 52. The FF 51 latches and holds the 16-bit parallel data DT_FIFO[15:0] in accordance with a 2-GHz clock CLK, for example, a clock with which the clock CLK16 is buffered while a control signal SEL_EN is active. The selector 52 selects one bit in the 16-bit data latched by the FF 51 in accordance with the DT_SEL[3:0] to output the selected bit as selection data DT_CP.

The edge detection circuit 44 detects the positional relationship between the transition edge of the internal clock CLK_JG and the transition edge of the TXOP_DT or TXON_DT to generate the voltage adjustment code CODE_RG for setting the amount of phase shift of the internal clock CLK_JG and the amount of delay in the TG 33 in the delay circuit.

Figure 8:
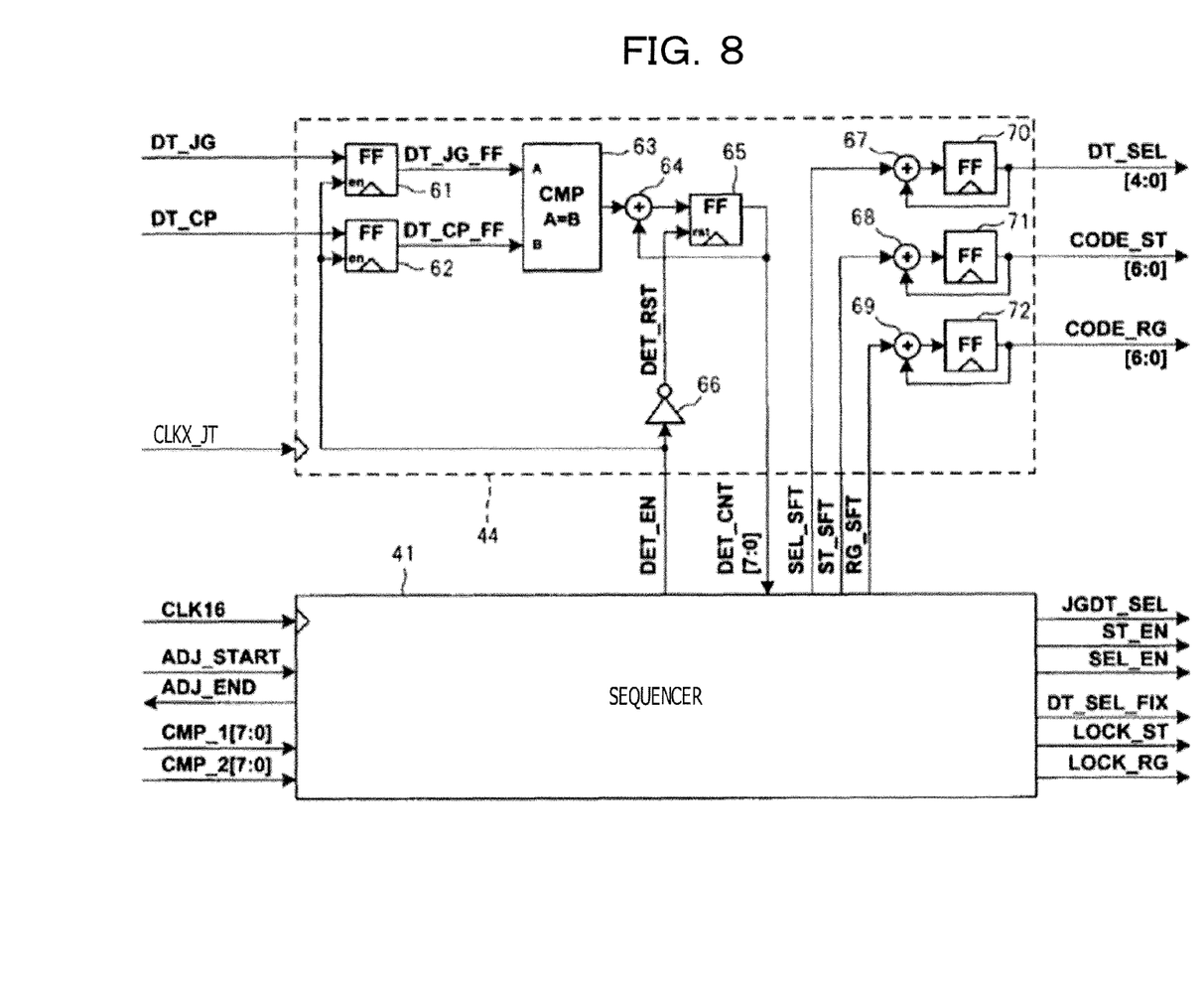
FIG. 8 illustrates an example of an edge detection circuit.

FIG. 8 illustrates an example of an edge detection circuit. Referring to FIG. 8, the edge detection circuit 44 includes six FFs 61, 62, 65, and 70 to 72, a comparator 63, adders 64 and 67-69, and an inverter 66. Pairs of the FFs 65 and 70 to 72 and the corresponding adders 64 and 67 to 69 may form counters.

The FFs 61 and 62 in the edge detection circuit 44 latch the DT_JG and the DT_CP in synchronization with an inverted clock CLKX_JT of an internal clock CLK_JT and the comparator 63 performs logical comparison to determine whether the latched DT_JG coincides with the latched DT_CP. The counter including the FF 65 and the adder 64 is reset when DET_RST is in the H level and counts up in synchronization with the inverted clock CLKX_JT if the result of the comparison indicates that the DT_JG coincides with the DT_CP while the DET_RST is in the L level. The counter including the FF 70 and the adder 67 counts up when SEL_SFT is active and outputs the count value as the selection signal DT_SEL for setting the amount of positional shift of the corresponding one bit data in the data selection circuit 42. The counter including the FF 71 and the adder 68 counts up when ST_SFT is active and outputs the count value as the CODE_ST for setting the amount of phase shift in the phase shifter 46. The counter including the FF 72 and the adder 69 counts up when RG_SFT is active and outputs the count value as the voltage adjustment code CODE_RG for setting the analog signal levels PVOL and NVOL from the regulator 43. The FFs 61 and 62 operate when DET_EN is active and terminate the operations when the DET_EN is inactive. The inverter 66 outputs the DET_RST resulting from inversion of the DET_EN.

Figure 9:
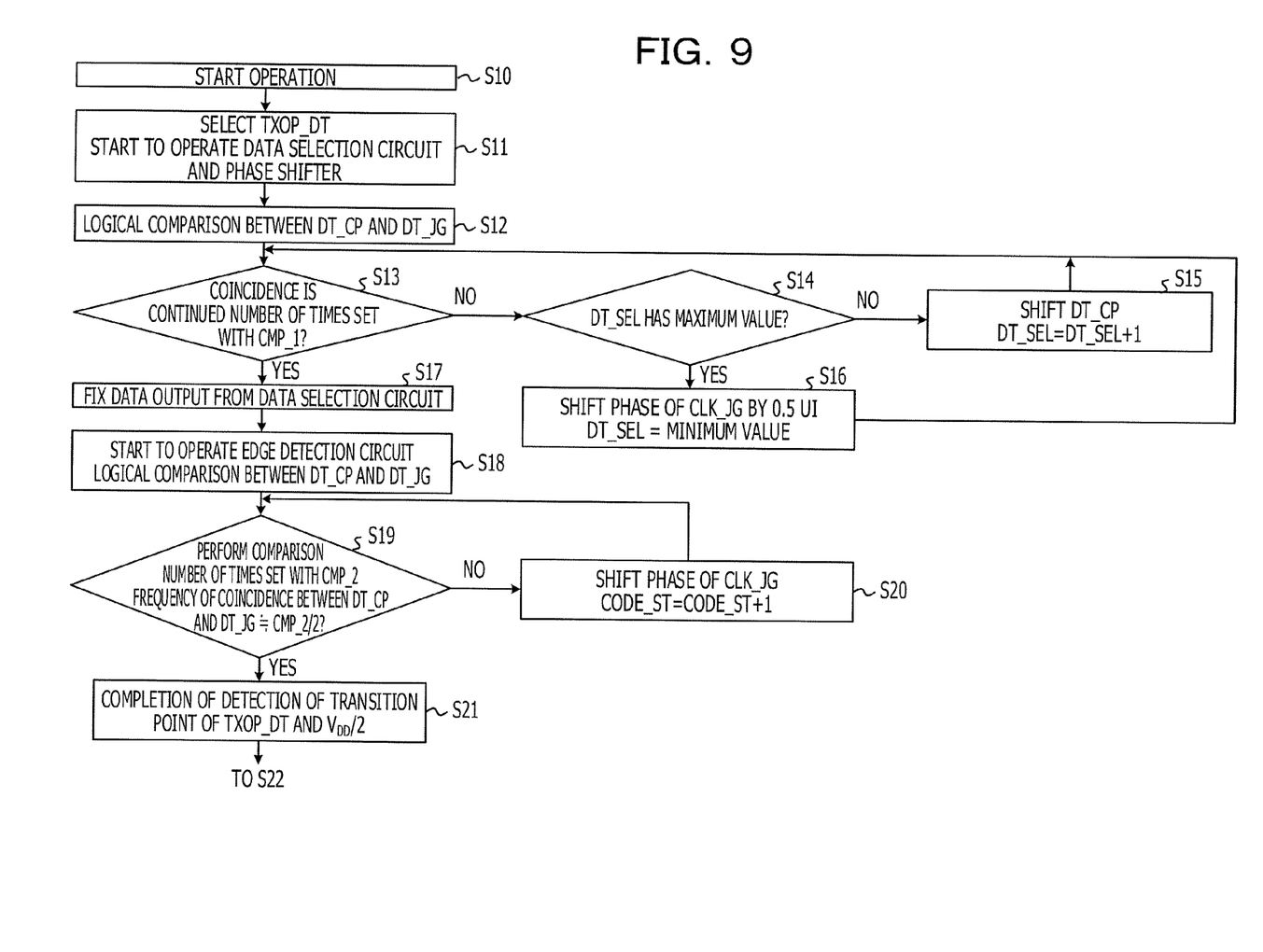
FIG. 9 illustrates an example of an operation to reduce skew.
Figure 10:
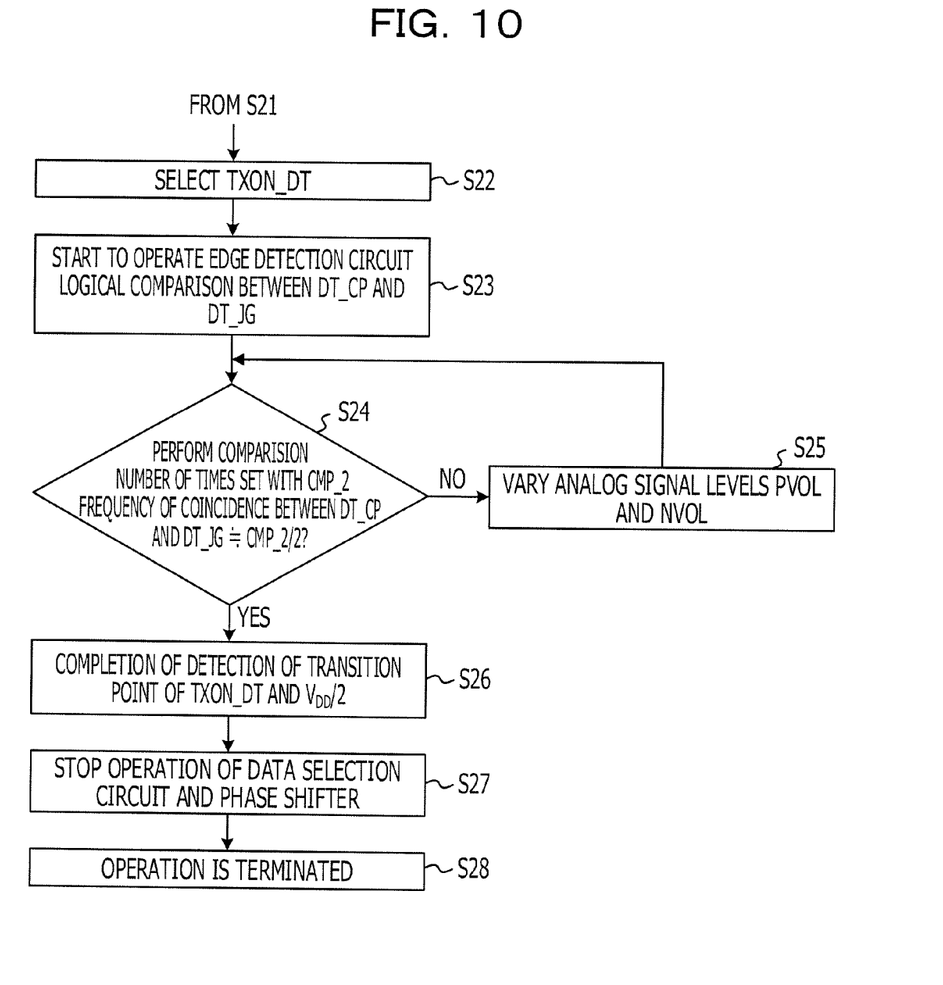
FIG. 10 illustrates an example operation to reduce skew.
Figure 11:
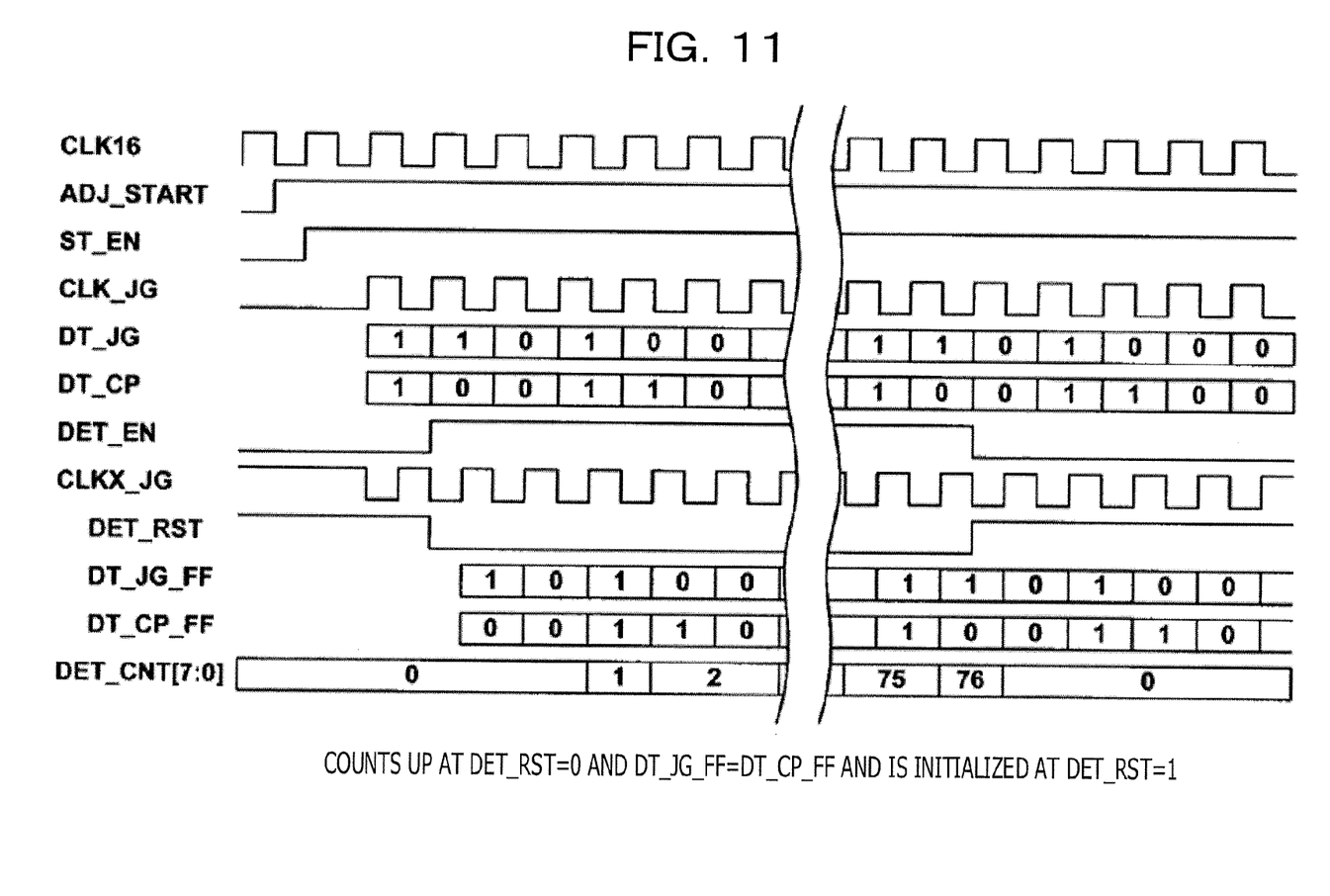
FIG. 11 illustrates an example of a variation of signals in a operation to reduce skew.

FIG. 9 and FIG. 10 illustrate an example of an operational process to reduce the skew (a deskewing operation). The deskewing operation illustrated in FIG. 9 and FIG. 10 may be performed by the transmission circuit illustrated in FIG. 1 or FIG. 4. FIG. 11 illustrates an example of a variation of signals in a operation to reduce skew. How the signals are varied in the deskewing operation by the transmission circuit illustrated in FIG. 1 or FIG. 4 is illustrated in FIG. 11.

Referring to FIG. 9, in Operation S10, upon reception of ADJ_START=1 from an external control logic by the sequencer 41, the deskewing-between-differential-output-data-signals circuit 36 starts the deskewing operation. In Operation S11, the control signal JGDT_SEL is set to one (JGDT_SEL=1), the selector 48 selects the TXOP_DT, and ST_EN=1 and SEL_EN=1 are set to make the data selection circuit 42, the buffer 45, and the phase shifter 46 in an operation state.

In Operation S12, DET_EN=1. The edge detection circuit 44 compares the value DT_JG of the TXOP_DT (SELDT) latched by the comparator 47 with the DT_CP output from the data selection circuit 42.

In Operation S13, DET_EN=0 is set and a value DET_CNT of the counter is set to an initial value of zero. It is determined whether the coincidence between the DT_JG and the DT_CP detected in each cycle of the clock CLK16 continues a number of times set with the CMP__1. If the coincidence continues the set number of times, the process goes to Operation S17. If the coincidence does not continue the set number of times, the process goes to Operation S14.

In Operation S14, it is determined whether the selection signal DT_SEL for the corresponding one bit data supplied from the edge detection circuit 44 to the data selection circuit 42 has a maximum value. For example, the maximum value of the selection signal DT_SEL may be equal to 15. The initial value of the selection signal DT_SEL at the time when the edge detection circuit 44 starts to operate is set to a minimum value of zero in Operation S12. If the selection signal DT_SEL does not have the maximum value, the process goes to Operation S15. If the selection signal DT_SEL has the maximum value, the process goes to Operation S16.

In Operation S15, the sequencer 41 supplies SEL_SFT=1 to the edge detection circuit 44 and, upon reception of SEL_SFT=1, the edge detection circuit 44 increments the selection signal DT_SEL to be supplied to the data selection circuit 42 by one. The data selection circuit 42 shifts the bit position for selecting the corresponding one bit data DT_CP by one and the process goes back to Operation S13.

Operations S13 to S15 are repeated until the determination of the coincidence in Operation S13 continues the set number of times and until the selection signal DT_SEL has the maximum value. If the selection signal DT_SEL has the maximum value in Operation S14, the process goes to Operation S16.

In Operation S16, the phase of the internal clock CLK_JG output from the phase shifter 46 is shifted by 0.5 UI and the selection signal DT_SEL is returned to the minimum value (the initial value). Then, the process goes back to Operation S13. Operations S13 to S15 are repeated until the determination of the coincidence in Operation S13 continues the set number of times. When the process goes to Operation S17, the corresponding one bit data DT_CP corresponds to the transition edge of the internal clock CLK_JG output from the phase shifter 46.

In Operation S17, the selection signal DT_SEL is fixed (DT_SEL_FIX=1) and the DT_CP output from the data selection circuit 42 is fixed as the corresponding one bit data. In Operation S18, the edge detection circuit 44 is in the operation state again (DET_EN=1) and the value DT_JG of the TXOP_DT (SELDT) is compared with the DT_CP.

In Operation S19, DET_EN=0 and the value DET_CNT of the counter is set to the initial value zero. Among the numbers of times set with the CMP__2, the number of times when the DT_JG coincides with the DT_CP is counted to calculate the frequency of the coincidence, for example, the number of times of coincidence/the total number of samples. It is determined whether the frequency of the coincidence is halved. If the frequency of the coincidence is not halved, the process goes to Operation S20. If the frequency of the coincidence is halved, the process goes to Operation S21.

In Operation S20, the sequencer 41 supplies ST_SFT=1 to the edge detection circuit 44 and, upon reception of ST_SFT=1, the edge detection circuit 44 increments the CODE_ST to be supplied to the phase shifter 46 by one. In response to the increment of the CODE_ST, the phase shifter 46 shifts the phase of the internal clock CLK_JG to be output by one unit interval. Repetition of Operations S19 and S20 causes the frequency to be decreased from one and to pass through ½. When the frequency passes through ½, the transition edge of the internal clock CLK_JG coincides with the edge of one unit interval (1 UI) of the TXOP_DT.

In Operation S21, the adjustment to make the transition edge of the TXOP_DT equal to the expected amplitude value $V_{DD}/2$ is completed. Fixing LOCK_ST to one fixes the phase of the internal clock CLK_JG output from the phase shifter 46. The fixed internal clock CLK_JG may be the adjusted detection clock. Referring to FIG. 10, in Operation S22, JGDT_SEL=0 is set and the selector 48 is switched to select the TXON_DT.

In Operation S23, DET_EN=1 is set and the edge detection circuit 44 compares the value DT_JG of the TXON_DT (SELDT) latched by the comparator 47 with the DT_CP output from the data selection circuit 42.

In Operation S24, DET_EN=0 is set and the value DET_CNT of the counter is set to the initial value zero. Among the numbers of times set with the CMP_2, the number of times when the DT_JG coincides with the DT_CP is counted to calculate the frequency of the coincidence, for example, the number of times of coincidence/the total number of samples. It is determined whether the frequency of the coincidence is halved. If the frequency of the coincidence is not halved, the process goes to Operation S25. If the frequency of the coincidence is halved, the process goes to Operation S26.

In Operation S25, the sequencer 41 supplies RG_SFT=1 to the edge detection circuit 44 and, upon reception of RG_SFT=1, the edge detection circuit 44 increments the CODE_RG to be supplied to the regulator 43 by one. The regulator 43 varies the analog signal levels PVOL and NVOL to be output.

Repetition of Operations S24 and S25 causes the frequency to be decreased from one and to pass through ½. When the frequency passes through ½, the transition edge of the internal clock CLK_JG coincides with the edge of one unit interval (1 UI) of the TXON_DT. In Operation S26, the adjustment to make the transition edge of the TXON_DT equal to the expected amplitude value $V_{DD}/2$ is completed. Fixing LOCK_RG to one fixes the analog signal levels PVOL and NVOL output from the regulator 43.

In Operation S27, ST_EN=0 and SEL_EN=0 is set to stop the operations of the data selection circuit 42, the buffer 45, and the phase shifter 46. In Operation S28, the adjustment operation is terminated to output ADJ_END=1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A differential signal skew adjustment method comprising:
    converting a multi-bit parallel data signal into a serial data sequence as a differential data signal including a first polarity signal and a second polarity signal, by using a detection clock which is obtained by dividing a reference clock;
    adjusting a phase of the detection clock in accordance with a phase of the first polarity signal; and
    adjusting a phase of the second polarity signal in accordance with the adjusted phase of the detection clock to adjust skew between the first polarity signal and the second polarity signal.

2. The differential signal skew adjustment method according to claim 1, wherein the phase of the detection clock is adjusted in accordance with the phase of a first bit, the first bit being part of the serial data sequence of the first polarity signal and corresponding to a transition edge of the detection clock.

3. The differential signal skew adjustment method according to claim 2, wherein the phase of a second bit, the second bit being part of the serial data sequence of the second polarity signal and corresponding to the first bit, is adjusted in accordance with the adjusted phase of the detection clock.

4. The differential signal skew adjustment method according to claim 2, wherein, before the phase of the detection clock is adjusted, a position of the first bit in the serial data sequence is identified.

5. The differential signal skew adjustment method according to claim 2, wherein an amount of delay of the phase of the detection clock is varied so that a probability of coincidence between a value obtained by acquiring the first polarity signal with the detection clock and a value of data corresponding to the first bit is halved.

6. The differential signal skew adjustment method according to claim 2, wherein an amount of delay of the second polarity signal is varied so that a probability of coincidence between a value obtained by acquiring the second polarity signal with the detection clock and a value of data corresponding to the second bit is halved.

7. A transmission circuit comprising:
    a clock circuit configured to generate a reference clock and a detection clock, the detection clock being obtained by dividing the reference clock;
    a multiplexer configured to perform parallel-to-serial conversion on a multi-bit parallel data signal to generate a serial data sequence by using the detection clock;
    a differential output circuit configured to generate a differential data signal including a first polarity signal and a second polarity signal from the serial data sequence to output the differential data signal in accordance with a cycle of the reference clock;
    a delay circuit configured to vary an amount of delay of the second polarity signal; and
    a skew control circuit configured to adjust a phase of the detection clock in accordance with a phase of the first polarity signal and control the delay circuit such that skew between the first polarity signal and the second polarity signal is reduced based on the output from the differential output circuit and the detection clock.

8. The transmission circuit according to claim 7, wherein the skew control circuit is configured to adjust a phase of the second polarity signal in accordance with the adjusted phase of the detection clock to adjust an amount of delay of the delay circuit.

9. The transmission circuit according to claim 8,
wherein the skew control circuit is configured to include a data selection circuit configured to extract a first bit corresponding to a transition edge of the detection clock from the serial data sequence, and
wherein, before the phase of the detection clock is adjusted, a position of the first bit in the serial data sequence is identified.

10. The transmission circuit according to claim 9,
wherein the skew control circuit is configured to include a phase shift circuit configured to vary an amount of delay of the phase of the detection clock, and
wherein the skew control circuit is configured to set a phase shift circuit such that a probability of coincidence between a value obtained by acquiring the first polarity signal with the detection clock and a value of data corresponding the first bit is halved.

11. The transmission circuit according to claim 9, wherein the skew control circuit is configured to set the delay circuit such that a probability of coincidence between a value obtained by acquiring the second polarity signal with the detection clock and a value of data corresponding the first bit is halved.

12. The transmission circuit according to claim 7, further comprising:
a single ended pre-driver configured to perform impedance conversion on a single-phase output from the multiplexer,
wherein the differential output circuit is further configured to include the delay circuit and generate the differential data signal including the first polarity signal and the second polarity signal from a single-phase output from the single ended pre-driver, and
wherein the delay circuit is configured to vary the amount of delay of the second polarity signal.

13. The transmission circuit according to claim 7, wherein the skew control circuit is configured to perform an adjustment operation in providing an operation signal and keep a control value of the delay circuit in a last provision of the operation signal when the operation signal is not provided.

* * * * *